United States Patent
Gavagnin et al.

(10) Patent No.: US 11,450,587 B2
(45) Date of Patent: Sep. 20, 2022

(54) HEAT REMOVAL MECHANISM FOR STACK-BASED ELECTRONIC DEVICE WITH PROCESS CONTROL COMPONENT AND PROCESSING COMPONENTS

(71) Applicant: AT&S Austria Technologie & Systemtechnik Aktiengesellschaft, Leoben (AT)

(72) Inventors: Marco Gavagnin, Leoben (AT); Gerald Weis, Bruck an der Mur (AT); Markus Leitgeb, Trofaiach (AT); Gernot Grober, Weißkirchen (AT); Young Hy Jung, Leoben (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 17/249,493

(22) Filed: Mar. 3, 2021

(65) Prior Publication Data

US 2021/0280490 A1 Sep. 9, 2021

(30) Foreign Application Priority Data

Mar. 5, 2020 (EP) .................................... 20161282

(51) Int. Cl.
| | |
|---|---|
| H01L 23/367 | (2006.01) |
| H01L 23/373 | (2006.01) |
| H01L 23/532 | (2006.01) |
| H01L 21/768 | (2006.01) |
| H01L 25/065 | (2006.01) |
| H01L 23/13 | (2006.01) |
| H01L 23/498 | (2006.01) |

(52) U.S. Cl.
CPC ...... H01L 23/3675 (2013.01); H01L 23/3736 (2013.01); H01L 23/5329 (2013.01);
(Continued)

(58) Field of Classification Search
CPC ............. H01L 23/3675; H01L 23/3736; H01L 23/53209; H01L 23/5329; H01L 25/0655;
(Continued)

(56) References Cited

U.S. PATENT DOCUMENTS

| | | | |
|---|---|---|---|
| 2008/0116586 A1 | 5/2008 | Kim et al. | |
| 2012/0063094 A1 | 5/2012 | Gaynes et al. | |
| 2014/0291818 A1 | 10/2014 | Zhao et al. | |
| 2014/0293563 A1 | 10/2014 | Loo et al. | |
| 2016/0155732 A1* | 6/2016 | Wu ................... | H01L 21/76898 438/108 |

(Continued)

FOREIGN PATENT DOCUMENTS

| | | |
|---|---|---|
| DE | 103 40 438 A1 | 4/2005 |
| DE | 10 2010 038 154 A1 | 5/2011 |

(Continued)

OTHER PUBLICATIONS

Kam, D.G. et al., Organic Packages With Embedded Phased-Array Antennas for 60-GHz Wireless Chipsets, IEEE Transactions on Components, Packaging and Manufacturing Technology, vol. I, No. 11, Nov. 2011; pp. 1806-1814; IEEE.

(Continued)

*Primary Examiner* — Patricia D Valenzuela
(74) *Attorney, Agent, or Firm* — Robert A. Blaha; Smith Tempel Blaha LLC (57) ABSTRACT

An electronic device includes a stack with at least one electrically conductive layer structure and/or at least one electrically insulating layer structure, a plurality of processing components on and/or in the stack, a process control component coupled with at least part of the processing components for transmitting signals and configured for controlling processes executed by the processing components and/or by the process control component, and a heat removal structure on or above which at least one of the process control component and the processing components is arranged.

15 Claims, 3 Drawing Sheets

(52) U.S. Cl.
CPC .. *H01L 23/53209* (2013.01); *H01L 21/76898* (2013.01); *H01L 23/13* (2013.01); *H01L 23/49827* (2013.01); *H01L 25/0655* (2013.01)

(58) Field of Classification Search
CPC ............ H01L 21/76898; H05K 1/0209; H05K 1/183; H05K 1/185; H05K 3/0061; H05K 3/4697; H05K 2201/09036; H05K 2201/09054; H05K 2201/10674; H05K 1/0204
See application file for complete search history.

(56) References Cited

U.S. PATENT DOCUMENTS

| | | | |
|---|---|---|---|
| 2016/0276307 | A1 | 9/2016 | Lin |
| 2016/0351545 | A1* | 12/2016 | Hong ..................... H01L 23/13 |
| 2017/0084592 | A1* | 3/2017 | Takatani ................. H01L 24/06 |
| 2017/0301608 | A1 | 10/2017 | Chang et al. |

FOREIGN PATENT DOCUMENTS

| | | |
|---|---|---|
| WO | 2017030634 A1 | 2/2017 |
| WO | 2018188167 A1 | 10/2018 |

OTHER PUBLICATIONS

Extended European Search Report in Application No. 20161282.7; pp. 1-14; dated Nov. 24, 2020; European Patent Office, 80298, Munich Germany.

\* cited by examiner

HEAT REMOVAL MECHANISM FOR STACK-BASED ELECTRONIC DEVICE WITH PROCESS CONTROL COMPONENT AND PROCESSING COMPONENTS

CROSS-REFERENCE TO RELATED APPLICATION

The present application claims the benefit of the filing date of the European Patent Application EP20161282.7, filed Mar. 5, 2020, the disclosure of which is hereby incorporated herein by reference.

TECHNICAL FIELD

Embodiments of the invention relate to a method of manufacturing an electronic device and to an electronic device.

Technological Background

In the context of growing product functionalities of component carriers equipped with one or more electronic components and increasing miniaturization of such components as well as a rising number of components to be connected to the component carriers such as printed circuit boards, increasingly more powerful array-like components or packages having several components are being employed, which have a plurality of contacts or connections, with ever smaller spacing between these contacts. In particular, component carriers shall be mechanically robust and electrically reliable so as to be operable even under harsh conditions.

For sophisticated electronic tasks, multiple silicon dies can be combined in a common electronic device. Instead of using a costly single semi-conductor chip fulfilling multiple electronic tasks, multiple individual silicon dies can be surface mounted on a printed circuit board and can be operated so that each die contributes to the overall electronic function. However, such electronic devices are space consuming, since ohmic heat generated during operation may require spacing the silicon dies with a significant distance in between.

Such devices may be mounted near to each other on the same plane. One possibility is to mount the devices on both faces of a component carrier in order to decrease the signal length and to save space in the horizontal plane. However, the heat dissipation of the components facing the component carrier is then becoming a real hurdle. Therefore, heat dissipation or management may be inappropriate which introduces shortcomings during operation.

SUMMARY

There may be a need for an electronic device which can be manufactured in a compact way and which can be operated efficiently.

According to an exemplary embodiment of the invention, an electronic device is provided which comprises a stack comprising at least one electrically conductive layer structure and/or at least one electrically insulating layer structure, a plurality of processing components on and/or in the stack, a process control component coupled with at least part (in particular with at least one, more particularly with at least two) of the processing components for transmitting signals and configured for controlling processes executed by the processing components and/or by the process control component, and a heat removal structure on or above which at least one of the process control component and the processing components is arranged for removing heat away from the stack.

According to another exemplary embodiment of the invention, a method of manufacturing an electronic device is provided, wherein the method comprises mounting a plurality of processing components on and/or in a stack comprising at least one electrically conductive layer structure and/or at least one electrically insulating layer structure, mounting a process control component, configured for controlling processes executed by at least one of the process control component and the processing components, on and/or in the stack in such a way that the process control component is coupled with at least part of the processing components for transmitting signals, and arranging at least one of the process control component and the processing components on or above a heat removal structure for removing heat out of the stack.

OVERVIEW OF EMBODIMENTS

In the context of the present application, the term "stack" may particularly denote an arrangement of multiple planar layer structures which are mounted in parallel on top of one another.

In the context of the present application, the term "layer structure" may particularly denote a continuous layer, a patterned layer or a plurality of non-consecutive islands within a common plane.

In the context of the present application, the term "process control component" may particularly denote a component having the capability of controlling processes of the process control component itself and/or of multiple processing components being coupled for signal transmission or being communicatively coupled. In particular, such a process control component may be a semiconductor chip which may be embodied as a processor for controlling processes, in particular synchronizing communication, between the processing components and the process control component. It may be in particular possible that the process control component synchronizes multiple processing components and/or reconstructs signals transmitted and/or processed by said processing components. For instance, a process control component may be a main chip or dominant chip of a module-type electronic device.

In the context of the present application, the term "processing components" may particularly denote components of an electronic device having signal processing functionality. In particular, such signal processing functionality may include communication capabilities of communicating signals between the processing components and/or the process control component. For example, each of the processing components may be configured as a semiconductor chip which can be configured to carry out a corresponding electronic processing task in the framework of the overall functionality of the electronic device. For instance, a processing component may be a subordinate chip or auxiliary chip of a module-type electronic device.

In the context of the present application, the term "heat removal structure" may particularly denote a physical structure being configured and arranged for removing heat specifically from an assigned component (such as one of the above-mentioned processing components and/or the process control component) mounted on or above the assigned heat removal structure. More specifically, such a heat removal structure may be configured so that a respective component can be mounted thereon, i.e., in close physical and thus thermal contact.

According to an exemplary embodiment of the invention, a module-type electronic device formed on the basis of a layer stack may be provided which electrically couples a plurality of processing components with a process control component which may coordinate or centrally manage the electronic functionality and/or processing tasks of the processing components. In the context of such a module implementing a plurality of in particular semiconductor chip-type components, an enormous amount of heat may be generated during operation, in particular when said components are mounted on and/or in a layer stack. Highly advantageously, one or more heat removal structures may be provided on or above which a respective one of the components may be mounted for establishing a thermal path between the heat removal structure and the assigned component. This may enable an efficient removal of heat out of or away from the stack of the module-type electronic device. For this purpose, a respective one of the heat removal structures may form a thermally conductive base or support for a respective one of the components mounted on or above the assigned heat removal structure. This may ensure an efficient removal of heat specifically created by the assigned component during operation of the electronic device away from the stack and thereby away from the components. An undesired overheating of the components and thus the formation of undesired hot spots may thereby be reliably prevented. Thus, a compact stack-based electronic device with sophisticated electronic functionality may be provided which shows at the same time an excellent thermal performance. The heat removal performance of the at least one heat removal structure may advantageously allow to arrange the various components close to each other so that a compact electronic device may be obtained. Advantageously, generated heat may be removed out of the stack in a highly directional way, as defined by the positioning and configuration of the heat removal structure(s).

In the following, further exemplary embodiments of the method and the electronic device will be explained.

In one exemplary embodiment, a TIM (thermal interface material) may be implemented which may expand and retract while heating and cooling. However, this is only one option or additional characteristic of the heat removal structure.

In an embodiment, the stack is a laminate-type stack. In such an embodiment, the stack may be a compound of multiple layer structures which are stacked and connected together by lamination, i.e., by applying pressure and/or heat.

In an embodiment, the stack, the processing components and the process control component form part of a component carrier (such as a printed circuit board (PCB) or an IC (integrated circuit) substrate). The one or more heat removal structures may be formed on a mounting surface of a mounting base (such as another printed circuit board) on which the component carrier, i.e., the stack with the components, may be mounted to thereby establish a coupling between the heat removal structure of the mounting base and an assigned component of the stack.

In another embodiment, the electronic device is configured as component carrier which may include the stack, the processing components, the process control component and the at least one heat removal structure. In such an embodiment, it is thus also possible that the one or more heat removal structures form part of a component carrier, such as a printed circuit board (PCB) or an IC (integrated circuit) substrate.

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an interposer, and an IC (integrated circuit) substrate. A component carrier may also be a hybrid board combining different ones of the above-mentioned types of component carriers.

In an embodiment, the heat removal structure is assigned to the process control component. This means that the heat removal structure is specifically arranged for removing heat from the process control component during operation of the electronic device. This may be advantageous when the process control component is arranged in a cavity at the bottom side of the stack with poor intrinsic heat removal capability. In contrast to this, it may be possible that no heat removal structure is assigned to the processing components, when the latter are surface mounted on the stack which results in an intrinsic proper heat removal capability towards an electronic environment. In the described embodiment and configuration, the heat removal structure may thus be configured for removing heat only from the process control component, not from the processing components.

Alternatively, a respective heat removal structure may be assigned to each of the processing components (in particular when they are mounted in a respective cavity at the bottom side of the stack with poor intrinsic heat removal capability), whereas no heat removal structure needs to be assigned to the process control component (when being surface mounted on the stack with proper heat removal capability towards an electronic environment). Hence, the heat removal structure may be configured for removing heat away only from the processing components, not from the process control component in the latter mentioned embodiment.

Further alternatively, a respective heat removal structure is assigned to each of the processing components and to the process control component for obtaining very efficient heat removal.

In an embodiment, the heat removal structure is configured for removing heat towards a mounting surface of the stack and onto a mounting base, wherein the stack is mounted at the mounting surface on the mounting base (in particular a printed circuit board). Thus, a vertical heat removal path may be defined from a bottom of the stack with its components downwardly into the mounting base.

In an embodiment, the process control component is configured for controlling, in particular synchronizing, communication between the processing components. For example, the process control component may exchange, coordinate and forward communication signals transmitted between the various processing components. During such a communication between multiple components within the electronic device, the process control component and the processing components may generate a considerable amount of heat which may be efficiently removed out of the stack by a respective heat removal structure assigned to a respective component.

In an embodiment, the process control component is configured for controlling processes executed by the above-mentioned mounting base on which the component carrier (including at least the stack and the components) is mounted.

When the component carrier-type stack with its surface mounted and/or embedded components is mounted on a mounting base, the process control component may fulfil the additional task of coordinating communication between the processing components of the stack with one or more communication units of the mounting base. For instance, one or more further electronic components may be surface mounted on and/or embedded in the mounting base and may also be controlled by the process control component of the stack.

In an embodiment, the process control component and the processing components are arranged at least two different vertical levels of the stack. By vertically stacking the various components on and/or in the stack, vertical connection paths between the various components within the flat stack may be ensured. This has a positive impact on the signal quality of the communication between the various components and may also contribute to a compact configuration in a horizontal plane.

In an embodiment, at least one of the process control component and the processing components is embedded in the stack or is arranged in a cavity formed in the stack. Embedding the respective components in an interior of the stack rather than surface-mounting them may further improve the compactness of the component carrier and may also keep the connection paths within the stack short. This may have, in turn, a positive impact on the signal transmission quality and may allow to manufacture the component carrier in a space-saving way. Arranging one or more of the components in a cavity with access to an exterior of the stack may simplify heat removal and coupling with a heat removal structure.

Still referring to the previously mentioned embodiment relating to the arrangement of a component in a cavity of the stack, the heat removal structure may be arranged at an exposed surface of the at least one of the process control component and the processing components arranged in the cavity. Thus, the heat removal structure may be positioned in a simple and precise way exactly where needed for significantly contributing to the thermal performance of the electronic device.

In an embodiment, at least one of the process control component and the processing components is surface-mounted on the stack. Additionally or alternatively to the above-described embedding or cavity-mounting of components in the component carrier, it may also be possible to surface-mount at least part of the components. Surface-mounting may simplify the heat removal from the components during operation, since such components are exposed to an environment of the component carrier which simplifies the heat transfer.

In the previously mentioned embodiment, it may be possible that no heat removal structure is arranged at the at least one of the process control component and the processing components being surface-mounted. Since heat removal of a surface mounted component is less problematic, a heat removal structure may be dispensable here, and eventually, subsequent mounting of a metal can be accomplished for better heat dissipation.

In an embodiment, the heat removal structure is configured for heat spreading. Thus, heat may not only be removed out of the component carrier but may also be spatially distributed over an extended spreading angle to prevent hot spots within the electronic device. In other words, the heat removal structure may not only be configured for removing heat away from a component, but also for distributing generated heat of the component over a larger spatial area, thereby preventing regions of excessive heating within the electronic device.

In an embodiment, the heat removal structure is thermally decoupled from the at least one other of the process control component and the processing components being not mounted on or above a respective heat removal structure. According to such a preferred embodiment, a heat removal structure may be assigned specifically only to one of the components for removing and/or spreading heat generated specifically at said component. By taking this measure, heat conduction from one component to another component may be prevented and the heat removal from the component assigned to a respective heat removal structure may be controlled in a defined way. Preferably, heat may be removed from a component via its assigned heat removal structure out of the stack towards a mounting base rather than to other components of the stack.

In an embodiment, the heat removal structure comprises a thermally conductive sheet, in particular a metallic sheet such as a copper layer. For instance, a base body of a heat removal structure may be a foil or plate which may have a high capability of removing heat from a respective component. It is also possible that a base body of a heat removal structure has another form, for instance a deposited copper layer, a structured layer, etc. Preferably, the shape and size of such a sheet or layer may correspond to (for instance may be identical to) the size and shape of the assigned component. As a result, a compact configuration may be obtained in which heat may be specifically removed from a respective component. Alternatively, it is possible that the size of the thermally conductive sheet is larger than the size of the component arranged thereon, to thereby achieve heat spreading in addition to heat removal.

In an embodiment, the heat removal structure comprises an array of thermally conductive protrusions extending vertically from the thermally conductive sheet. Basically, the protrusions may be any structures protruding beyond the thermally conductive sheet. For instance, the protrusions may be pillars, bumps, cylinders (in particular circular cylindrical structures), cuboids or any other body for instance with star shape or pentagonal shape. The protrusions may have walls at 90° angle or may have beveled walls. For instance, the protrusions may have conical or frustoconical shape on a heat removal sheet. Highly advantageously, a plurality of protrusions of electrically conductive material extending vertically from the metallic layer or sheet of the heat removal body may be provided. The protrusions may also be thermally conductive, for instance may be made of the same material as the sheet (for instance copper). A preferably two-dimensional array of protrusions may simultaneously contribute to a proper heat transfer between the component and the layer or sheet and may also ensure a proper mechanical connection between component and sheet. The latter advantage may simplify assembly of the components at the stack and/or between stack and a mounting base of the electronic device. Thus, the combination of a sheet and an array of protrusions (which may for instance be configured as spikes) may be highly advantageous. An advantage of the provision of protrusions is a better heat coupling due to a larger surface and a mechanical locking.

Alternatively, the heat removal structure can have a flat surface (i.e., may be provided without protrusions). An advantage with a flat surface is that more heat capacity may be obtained due to an increased amount of copper surface.

The decision whether to use protrusions or a flat surface may be made depending on the design and/or further limiting factors of a component carrier design.

In an embodiment, the electronic device comprises a thermally conductive thermal interface material (TIM) on or above the thermally conductive sheet. Advantageously, the TIM may at least partially cover the array of protrusions. The TIM may for example be a thermally conductive paste, but may also have a thermally conductive gap filler. Such a thermally conductive paste, which may also be electrically conductive, may promote a thermal coupling between a component and the assigned heat removal structure. For instance, the array of protrusions of the heat removal structure may be embedded in a paste-like layer of the thermal coupling paste so that a mechanically reliable assembly may be combined with a proper thermal coupling between heat removal structure and assigned component. For instance, the thermally conductive paste may be a solder paste.

In an embodiment, the heat removal structure is formed on a mounting surface of the mounting base so as to be thermally coupled with at least one of the components upon mounting the stack with the components on the mounting base. By mounting one or more of said components at the stack so as to extend up to a surface of the stack, the attachment of the stack with its components to the mounting base having the pre-assembled one or more heat removal structures of the above-mentioned type may simultaneously establish a proper electric contact between the electrically conductive layer structures of the stack and the mounting base, as well as a thermal contact between the at least one heat removal structure and a respectively assigned component. This contributes to an efficient manufacturing process.

In an embodiment, the electronic device comprises multiple heat removal structures, wherein a respective one of the process control component and the processing components is mounted on or above an assigned one of the heat removal structures. In particular, the stack and/or the mounting base may comprise multiple heat removal structures each thermally connected to a respective one of the components. Thus, heat removal can be controlled for each component individually, i.e., for each of the processing components and the process control component.

In an embodiment, a lateral extension of the process control component is larger than a lateral extension of each of the processing components. The higher level of functionality of the process control component may result in a larger size as compared to the processing components. It may for instance be advantageous to arrange all processing components at one common vertical level of the stack, whereas the process control component may be arranged at another vertical level of the stack.

In an embodiment, the at least one electrically conductive layer structure is configured so that signal paths between the process control component and the processing components are substantially vertical. Advantageously, this may result in short signal paths and thus low signal loss. Furthermore, this may contribute to a compact design of the electronic device.

As mentioned above, the electronic device may comprise a mounting base (in particular a printed circuit board) on which the stack with the process control component and the processing components may be mounted. For instance, the stack with its components may be connected to the mounting base by soldering. Advantageously, such an electrical and mechanical connection between stack and mounting base may simultaneously establish a thermal coupling between a respective one of the components and an assigned heat removal structure.

In an embodiment, the heat removal structure is arranged at an interface between the mounting base and the stack with the process control component and the processing components. Such a configuration may promote heat conductance from the stack with its components into the mounting base and thus away from the sensitive components of the stack.

As already mentioned above, the electronic device may comprise a thermal interface material (TIM). The thermal interface material may be arranged between the heat removal structure and said at least one of the process control component and the processing components mounted on or above the heat removal structure. Furthermore, the thermal interface material may be configured for thermally expanding when heated (for instance during operation of the electronic device) to thereby trigger a thermal coupling between the heat removal structure and a surface of said at least one of the process control component and the processing components mounted on or above the assigned heat removal structure. Moreover, the thermal interface material may be configured for shrinking at lower temperatures (for instance at room temperature) to a smaller size in which the heat removal structure is not thermally coupled by the thermal interface material with the surface of said at least one of the process control component and the processing components mounted on or above the assigned heat removal structure. Thus, a self-sufficient system of establishing or deactivating a thermal coupling between stack and mounting base may be provided.

In an embodiment, the process control component is configured for controlling processes executed by the mounting base, in particular executed by at least one electronic component of the mounting base. In addition to the control of the processing components at the stack, the process control component may additionally control one or more additional components of the mounting base.

In an embodiment, the heat removal structure is formed on a mounting surface of the mounting base so as to be thermally coupled with at least one of the process control component and the processing components upon mounting the stack with the process control component and the processing components on the mounting base. Thus, the heat removal structure may be preassembled on the mounting base. Connecting the stack with its components to the mounting base, for instance by soldering, may then automatically establish a thermal path guiding heat from the components of the stack into the mounting base.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and the component carrier may be nevertheless very thin and compact.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through holes through the laminate, for instance by laser drilling or mechanical drilling, and by filling them with electrically conductive material (in particular copper), thereby forming vias as through hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers, fabrics).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) and/or a photo-imageable or dry-etchable organic material like epoxy-based build-up material (such as epoxy-based build-up film) or polymer compounds like polyimide, polybenzoxazole, or benzocyclobutene.

In an embodiment, the at least one electrically insulating layer structure comprises at least one of the group consisting of resin (such as reinforced or non-reinforced resins, for instance epoxy resin or bismaleimide-triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (Teflon®), a ceramic, and a metal oxide. Teflon® is a registered mark of The Chemours Company FC LLC of Wilmington, Del., U.S.A. Reinforcing materials such as webs, fibers or spheres, for example made of glass (multilayer glass) may be used as well. Although prepreg particularly FR4 are usually preferred for rigid PCBs, other materials in particular epoxy-based build-up film or photo-imageable dielectric material may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

At least one component, which can be optionally surface mounted on and/or embedded in the stack and/or the mounting base, can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, etc.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment of the invention, an electronic device for removing and/or spreading heat from a respective die in a package is provided. More specifically, heat can be removed and/or spread in an electronic device including a process control component and multiple further processing components, wherein the heat removal and/or heat spreading may be accomplished by one or more dedicated heat removal structures.

According to an exemplary embodiment of the invention, a heat spreading architecture is provided in which a preferential and well-defined heat path from a module-type layer stack with components through a mounting base (such as a printed circuit board) is accomplished on which the stack with its components may be mounted. Furthermore, a modular thermal and electrical coupling system is provided, allowing short signal paths and high signal speed when transmitting signals among the components (in particular integrated circuits) within a system in package (SiP) type electronic device.

In an embodiment, it is possible to provide a guided heat path from a component (i.e., one of the above-mentioned process control component and processing components) within a cavity of a substrate directly to the mounting base (in particular PCB) underneath. This may allow for the provision of a dynamic cooling using a heat removal structure made of a heat conductive material. In an embodiment, the material of such a heat removal structure may expand when heated to thereby touch a cold surface and may shrink to its original size when is cooled down. This may make it possible to obtain a smaller form factor thanks to the integration of a respective component within the cavity. Furthermore, short electrical paths and consequently high signal speed may be obtained due to the fact that input/output terminals between the component(s) in the cavity and those on top on the (for instance substrate or printed circuit board type) stack are facing each other. Exemplary embodiments of the invention may allow obtaining a better heat spreading performance as heat paths may be created on top of the electronic device as well as directly through the, for instance, PCB-type mounting base beneath the stack (for instance substrate). The provision of one or more heat removal structures on the mounting base of a smart device may offer an anchoring for the heat conductive material on the back of a process control component as well as a high contact surface for better heat spreading.

Exemplary embodiments of the invention may, for instance, be implemented for high performance computing (for example in a server, a laptop, a car, etc.). In particular, embodiments of the invention may be advantageously implemented in split die re-combination applications. High signal speed and miniaturization can be obtained simultaneously according to exemplary embodiments of the invention. In particular, a heat dissipation architecture as described herein may allow a higher system performance as excessive heat may negatively affect the performance of the integrated circuits at system level.

According to an exemplary embodiment of the invention, a component carrier with integrated process control component and multiple further processing components may be provided which allows coordinating signal transfer within the stack of the electronic device. More specifically, the process control component may be configured for synchronizing or coordinating communication between the processing components and/or an electronic environment, for instance a mounting base on which the component-carrying stack may be mounted. With such a configuration, a module type electronic device with sophisticated electronic functionality may be provided in which however a considerable amount of heat may be generated in a small volume. In order to avoid excessive heating of such an electronic device during operation, one or more heat removal structures may be provided which may be assigned to a respective one of the components (i.e., the process control component and/or the processing components) for a component-specific heat management thereof. Such a heat removal structure may preferably be embodied as a metallic sheet or layer with an array of vertically extending thermally conductive protrusions which may protrude towards or even up the assigned component for providing a proper thermal and mechanical, and optionally also electric, coupling. By assigning individual heat removal structures to the individual components of the electronic device, proper heat removal and heat spreading may be ensured. Descriptively speaking, such a configuration may allow to establish a heat guiding structure in a PCB or another component carrier, wherein the heat guiding structure may be composed of a plurality of horizontally and/or vertically extending heat removal structures within and/or below the component carrier. Optionally, the mentioned heat removal structures may be combined with other heat removing structures, such as a heat pipe, a copper inlay, a heating slot, etc. Such heat removing structures may or may not be integrated within the mounting base (PCB). Highly preferably, the one or more heat removal structures may be made of copper material rendering them properly compatible with PCB manufacturing technology. According to an exemplary embodiment, a method of spreading heat from dies in a package-type electronic device may be provided.

For instance, the heat removal structures and the electrically conductive layer structures of the PCB (printed circuit board) type mounting base may result in a percentage of between 20 vol.-% and 90 vol.-% copper in relation to the PCB (printed circuit board) type mounting base. The mentioned relatively high copper content may be achieved for instance over the whole electronic device or, in another embodiment, specifically in a region below a respective one of the components.

In the past decades, the system on chip (SoC) integration allowed an increasing functionality and computational power within a monolithic silicon die driven by Moore's Law (doubling of the density of transistors on new integrated circuit every 18 months). However, such a miniaturization evolution is now approaching its fundamental physical limits. On its place, system in package (SiP) technologies are flourishing, providing the integration of an increasing number of components (active and/or passive components) having different functionality within one module. One of the main challenges in SiP modules is to achieve an efficient heat spreading to cool down the system when operating, particularly in high performance computing applications.

According to an exemplary embodiment of the invention, a heat removal and optionally also heat spreading, mechanism is provided which creates a preferential heat path from a module-type stack through a mounting base (in particular a printed circuit board) on which the stack may be mounted. Furthermore, a highly advantageous modular concept is provided, allowing short signal paths, hence high signal speed, among integrated circuits within the Sip.

In an embodiment, the electronic device may be provided in a chiplet configuration. A chiplet may denote an integrated circuit block that is specifically designed to work with other similar chiplets to form larger more complex chips. In such chips, a system may be subdivided into functional circuit blocks, which may be called chiplets. Thus, process control component and/or processing components may be provided in a chiplet configuration.

More specifically, an electronic device provided according to exemplary embodiments of the invention includes an integrated circuit substrate (i.e., a stack) having a recess accommodating a first electronic component assembled within it so that the input/output terminals of the first electronic component are electrically connected to the inner surface of the cavity. The mentioned first electronic component may be in particular a process control component configured for controlling processes of other processing components of the electronic device. Thus, multiple further processing components (which may also be embodied as semiconductor dies) may be assembled on the substrate (i.e., may be surface mounted on the stack) on the opposite side in respect to the cavity. The IC substrate, as an example for a component carrier which may be used as stack according to an exemplary embodiment of the invention, may be connected to a mounting base (such as a PCB) so that the process control component back side is facing the mounting base. In particular, a mounting base having a heat conductive surface (for example created by structuring copper) may face the process control component in the clarity. Moreover, a thermally conductive layer (forming at least part of the heat removal structure) may be arranged in between the heat conductive surface of the mounting base and the process control component. A corresponding system configuration allows a short electronic interconnection path between the process control component and the processing components on the opposite side with respect to the cavity. In order to control or synchronize the other processing components, the process control component may for instance be embodied as an FPGA (field programmable gate array), a die handling memory, a PCI (Peripheral Component Interconnect) device or any other semiconductor component being capable of synchronizing electronic signals among the different processing components on the opposite side in respect to the cavity. The process control component may also be configured for synchronizing or controlling other electronic modules on and/or in the mounting base below the, for instance, substrate-type component carrier.

According to another exemplary embodiment, the previously described arrangement of process control component and processing components may be exchanged, i.e., the processing components may be arranged in a respective cavity and the process control component may be surface mounted on the stack.

For instance, the various processing components controlled by the process control component may be identical integrated circuits with the same functionality and design. This may allow for a good scalability, for instance to increase the number of cores available for computational power by increasing a number of equal integrated circuits (die splitting) instead of increasing the dimensions of the integrated circuit (monolithic approach). Such a modular and scalable approach is usually named "chiplets". However, it is alternatively also possible that the processing components are different integrated circuits with different functionality. For instance, the processing components can be graphic processing units (GPU), central processing units (CPU), high bandwidth memories (HBM) with integrated controller, etc.

In order to properly dissipate heat from the processing components and/or the process control component, additional measures may be taken. Examples for said additional measures are metal cans, thermal interface material (TIM), thermal grease or other heat conductive materials. However, an exemplary embodiment of the invention additionally implements one or more heat removal structures to remove heat in particular from an assigned one of the process control component or a respective one of the processing components, respectively. This may be achieved by implementing one or more heat removal structures which may be composed of a metallic layer or sheet in combination with protrusions vertically protruding therefrom. In particular, such a heat removal structure may be placed on the mounting base before the assembly of the, for instance, substrate-type component carrier or stack. It is also possible to apply such a heat removal structure on the process control component or the processing component before its assembly on and/or in the, for instance, substrate type component carrier or stack. In an embodiment, it may be possible to apply such a heat removal structure both on the respective component and the mounting base before the assembly between the, for instance, substrate type component carrier or stacked with its components and the mounting base. It is also possible to provide such a heat removal structure after the substrate assembly on the mounting base as an underfill. A corresponding heat conductive material may establish a thermal path from the assigned component to the mounting base arranged below.

In an embodiment, it may be possible to implement a dynamic heat spreading function of the heat removal structure(s). This can be accomplished by using a heat conductive material (for instance of a thermal interface material) which is expanding when heated. This means that when the respective component (in particular the process control component) is not operating, the heat conductive material on its surface will not touch the mounting base below. Once the component starts operating and heating up, the heat conductive material may thermally expand to thereby touch the surface of the mounting base below, thereby activating the heat path cooling the component. Once the component cools down, the heat conductive material may shrink back to its previous form. Thus, the heat removal structure may be advantageously arranged and configured for expanding when heated to thereby touch a surface of the mounting base and for shrinking at lower temperatures to a smaller size in which the heat removal structure does not touch the surface of the mounting base. This approach will allow having a higher temperature control of the component.

The mounting base below the component carrier may have a heat conductive surface directly below the (for instance process control) component, which can for instance be a structured copper surface, preferably provided with copper pillars (and/or other protrusions allowing a mechanical anchoring and increased contact surface for heat dissipation). The structured copper surface may offer a high contact surface between the heat spreading material and the mounting base. Furthermore, it may provide an improved adhesion as the structures may offer a better anchoring between the mounting base and the heat spreading material. The copper surface may then be connected to bulk heat conductive material (for instance a heat sink, a casing of the electronic device, a metal can on top of the substrate, etc.) so that the heat may be guided away from the component and from the component carrier or the electronic device as a whole.

In an embodiment, the electronic device may be provided with a heat path within the layout of the stack or component carrier and/or the mounting base. Furthermore, one or more heat spreading components (for instance copper coins, heat slugs, etc.) can be integrated into the layer stack and/or the mounting base.

In various embodiments, different kinds of packages for the components may be included, such as a bare die configuration, a bare die with copper layer or copper block on it, a die in a molded package, etc. However, other configurations for the electronic device are possible, such as the embedding of the respective component in a substrate type component carrier rather than in a cavity. In such a configuration, the back side of the component may face a TIM. It is also possible to embed the respective component and cover it with a copper layer for better thermal distribution. In yet another embodiment, the processing components being controlled by the process control component may be embedded in a cavity while the process control component is arranged on top of the, for instance, substrate type component carrier.

Thus, an exemplary embodiment of the invention provides a heat path from a processing component and/or a process control component within a cavity of a (for instance substrate-type) stack or component carrier directly to a mounting base (such as a printed circuit board, PCB) directly underneath. It may however also be possible to allow a dynamic cooling using a heat conductive material which expands when heated touching a cold surface of the mounting base and shrinks to its original size when it is cooled down.

According to an exemplary embodiment of the invention, it may be possible to obtain a small form factor thanks to the integration of at least part of the components within a cavity. A short electrical path may be achieved, hence a high signal speed, due to the fact that the input/output terminals between the respective component in the cavity and those on top of the (for instance substrate-type) stack may be arranged to face each other. Furthermore, a better heat spreading performance may be achieved, as heat paths may be on top of the electronics device as well as directly through the mounting base below the stack. The structures on the mounting base may offer an anchoring for the heat conductive material on the back of the respective component as well as a high contact surface for better heat spreading. According to an exemplary embodiment of the invention, high signal speed may be synergistically combined with miniaturization. Furthermore, heat dissipation may be carried out to achieve a better system performance as heat may otherwise negatively affect the performance of the various components.

Figure 1:
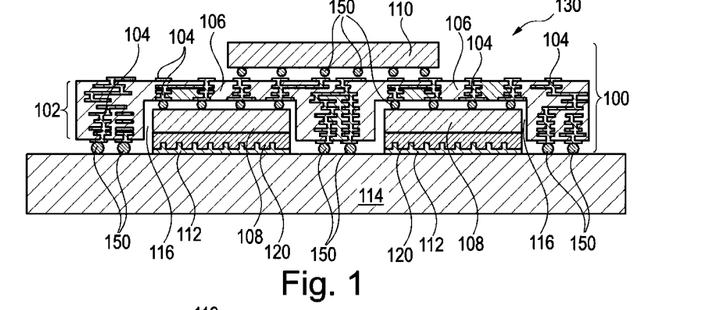
FIG. 1 illustrates a cross-sectional view of a component carrier-based electronic device according to an exemplary embodiment of the invention.
Figure 2:
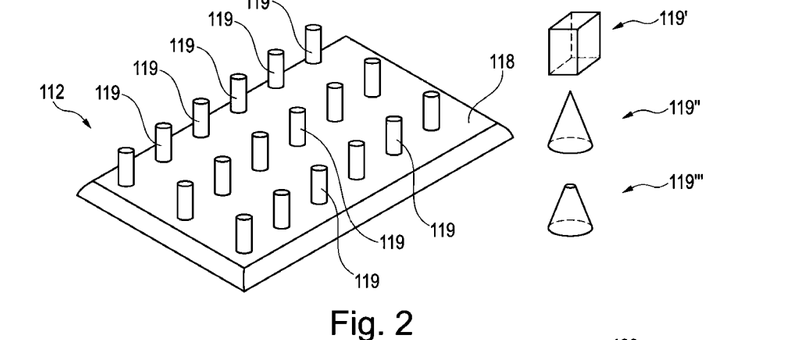
FIG. 2 illustrates a three-dimensional view of a heat removal structure with a thermally conductive sheet and thermally conductive protrusions according to an exemplary embodiment of the invention.

FIG. 1 illustrates a cross-sectional view of an electronic device 130 with a component carrier 100 and a mounting base 114 according to an exemplary embodiment of the invention. FIG. 2 illustrates a three-dimensional view of a heat removal structure 112 with a flat sheet 118 and protrusions 119 which may be implemented in the electronic device 130 and also in other exemplary embodiments of the invention. The electronic device 130 comprises PCB (printed circuit board) type or IC substrate type mounting base 114 and the PCB type or IC (integrated circuit) substrate type component carrier 100 being mounted on the mounting base 114.

According to FIG. 2, the protrusions 119 may have the shape of cylinders. However, they may also have the shape of a cuboid (see reference sign 119'), of a cone (see reference sign 119"), or may have frustoconical shape (see reference sign 119'"). Other shapes are possible as well.

The heat removal structures 112 may be fixed on the top side of the mounting base 114 prior to the assembly between component carrier 100 and mounting base 114 resulting in the electronic device 130 shown in FIG. 1. During assembly, each heat removal structure 112 may be attached to an assigned processing component 108 (such as a power amplifier or power management component) at a bottom of a layer stack 102 of the component carrier 100 during said assembly. Thus, the heat removal structures 112 may be initially formed on a mounting surface of the mounting base 114. Thereafter, the stack 102 with a process control component 110 (such as a bias control chip) and the processing components 108 can be mounted or assembled on the mounting base 114 to thereby thermally couple the heat removal structures 112 with said processing components 108. In an alternative embodiment, it is also possible to fix the heat removal structures 112 initially on the bottom side of the processing components 108 rather than providing them at the mounting surface of the mounting base 114.

The component carrier 100 comprises laminated layer stack 102 composed of electrically conductive layer structures 104 and electrically insulating layer structures 106. For example, the electrically conductive layer structures 104 may comprise patterned copper foils and vertical through connections, for example copper filled laser vias. The electrically insulating layer structures 106 may comprise a resin (such as epoxy resin), optionally comprising reinforcing particles therein (for instance, glass fibers or glass spheres). For instance, the electrically insulating layer structures 106 may be made of prepreg or FR4 or build-up film such as ABF. The layer structures 104, 106 may be connected by lamination, i.e., the application of pressure and/or heat.

Also, a liquid type dielectric may be applied for creating at least part of the electrically insulating layer structures 106 by coating methods (such as slit coating). In that case, no pressure or excessive amount of heat is needed for applying the dielectric to a surface, but rather it may be applied by a coating process (for instance, slit coating). Thus, the layer structures 104, 106 may be connected by lamination, i.e., the application of pressure and/or heat, and/or by coating, for instance, slit coating, spray coating etc., and may be cured afterwards by means of light (such as ultraviolet) radiation, heat, etc.

As shown, two (or more) processing components 108 (for example a CPU, a GPU, or an HBM) are mounted in a respective cavity, on a bottom side of the stack 102. One (or more than one) process control component 110 (for instance a CPU, a GPU, an FPGA, a synchronizer, a memory handling unit, etc.) is configured for controlling processes executed by the processing components 108. As shown, the process control component 110 is surface mounted on the top side of the stack 102. The process control component 110 and the processing components 108 are communicatively coupled and electrically connected for electric signal transmission by substantially vertically extending electrically conductive layer structures 104 of the stack 102. The process control component 110 is configured for controlling and synchronizing communication between the processing components 108.

Each of the heat removal structures 112 is provided below an assigned one of the processing components 108. Each heat removal structure 112 may be a structured copper surface directly below the respective processing component 108 in the respective cavity 116. Each heat removal structure 112 is configured for guiding heat away from the stack 102 and its components 108, 110 into the mounting base 114 and may also contribute to heat spreading. Each heat removal structure 112, assigned to the one of the processing components 108 being mounted on the respective heat removal structure 112 via a thermal interface material 120 in between, is thermally decoupled from the other components 108, 110 to prevent undesired cross transfer of heat to the latter mentioned components 108, 100. Each heat removal structure 112 comprises a thermally conductive sheet 118, for instance a copper plate. Moreover, each heat removal structure 112 comprises a two-dimensional array of protrusions 119 extending vertically from the thermally conductive sheet 118. The protrusions 119 may for example be copper spikes extending vertically from the thermally conductive sheet 118. Moreover, a thermally conductive paste (for instance, a solder paste) or the like may be provided as said thermal interface material 120 on the sheet 118 and may also at least partially cover the protrusions 119.

As shown, each heat removal structure 112 has substantially the same lateral extension as the respective processing component 108 which is mounted on said heat removal structure 112. This keeps the electronic device 130 compact.

As shown in FIG. 1, the process control component 110 is arranged at a higher vertical level than the side-by-side arranged coplanar processing components 108 (alternatively, also the process control component 110 may be embedded in an interior of the stack 102 or may be arranged in a cavity 116 formed in the stack 102, which may be denoted as a double cavity arrangement). Thus, the components 108, 110 are partially vertically stacked. As shown in FIG. 1, cavities 116 have been formed in a lower main surface of the stack 102 for subsequently accommodating the processing components 108 in said cavities 116, however still being exposed with respect to the stack 102. The process control component 110 is surface-mounted on the stack 102. The heat removal structures 112 are provided below both processing components 108. No heat removal structure 112, as the ones provided for processing components 108, is foreseen for process control component 110 showing intrinsically a proper heat removal capability, since it is surface mounted on the stack 102. Moreover, a TIM (thermal interface material) and/or metal on top may cool the process control component 110.

For a simple assembly, it is for instance possible that the heat removal structures 112 are formed on an upper main surface of the mounting base 114. Subsequently, the component carrier 100 may be assembled on the upper main surface of the mounting base 114 so that each of the processing components 108 is automatically connected with and thermally coupled with the respectively assigned heat removal structure 112. As shown in FIG. 1, assembly of the process control component 110 on the stack 102, assembly of the processing components 108 in the respective cavity 116 and assembly of the component carrier 100 on the mounting base 114 may be established by soldering using solder structures 150 in between.

Figure 3:
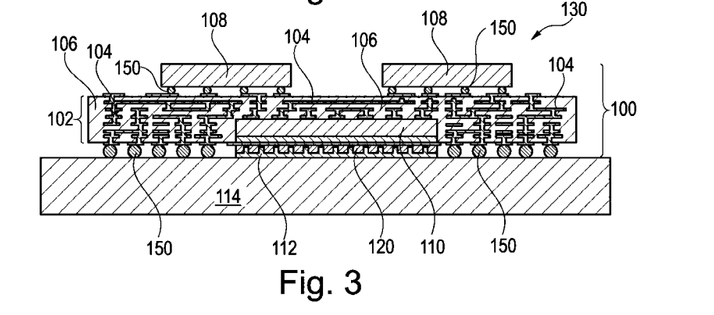
FIG. 3 illustrates a cross-sectional view of a component carrier-based electronic device according to another exemplary embodiment of the invention.

FIG. 3 illustrates a cross-sectional view of an electronic device 130 with a component carrier 100 according to another exemplary embodiment of the invention.

FIG. 3 relates to an embedded die version of the package. The embodiment shown in FIG. 3 differs from the embodiment shown in FIG. 1 in that the processing components 108 are surface-mounted and the process control component 110 is embedded in the stack 102. Consequently, the heat removal structure 112 extending upwardly from an upper main surface of the mounting base 114 may be thermally coupled with the process control component 110 according to FIG. 3. As in FIG. 1, electrically conductive layer structures 104 of the stack 102 electrically connect the processing components 108 with the process control component 110.

Figure 5:
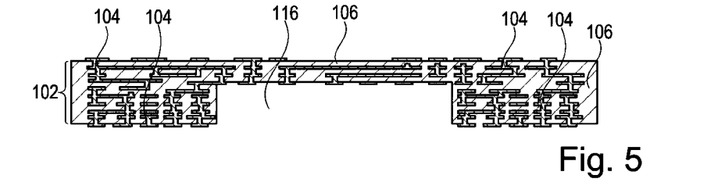
Figure 6:
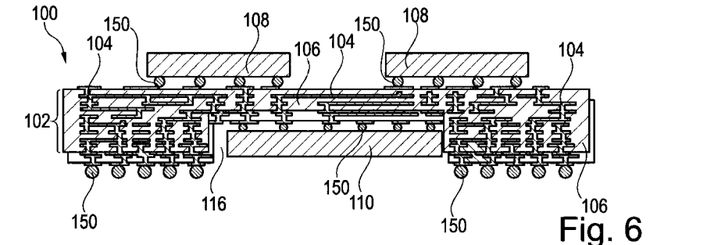
Figure 7:
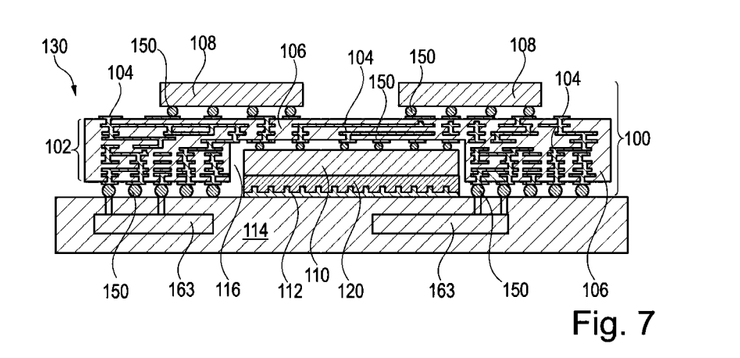

FIG. 4 to FIG. 7 illustrate cross-sectional views of structures obtained during carrying out a method of manufacturing an electronic device 130 with a component carrier 100, shown in FIG. 7, according to still another exemplary embodiment of the invention.

Figure 4:
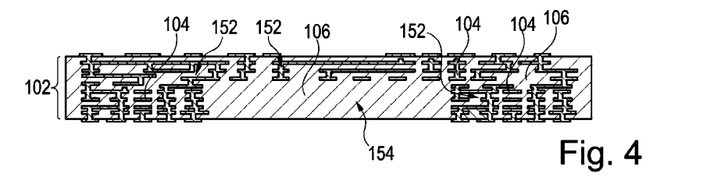
FIG. 4, FIG. 5, FIG. 6 and FIG. 7 illustrate cross-sectional views of structures obtained during carrying out a method of manufacturing a component carrier-based electronic device, shown in FIG. 7, according to still another exemplary embodiment of the invention.

As shown in FIG. 4, a flat planar plate-shaped stack 102 is provided having high density integration areas 152 and a region 154 without electrically conductive layer structures 104 in a central bottom portion of the stack 102. The stack 102 can be manufactured by lamination of multiple electrically conductive layer structures 104 and electrically insulating layer structures 106.

In order to obtain the structure shown in FIG. 5, a cavity 116 may be formed by removing material of the stack 102 in region 154. For example, this may be accomplished by embedding a material having low adhesion properties within the layer stack 102, for instance, a waxy component or a Teflon® layer. Thereafter, a circumferential cut may be carried out, preferably by a laser, so as to cut out a central bottom piece of the stack 102 upwardly delimited by the layer with low adhesion properties and circumferentially delimited by the laser cut. The corresponding piece of the stack 102 may then be simply taken out to obtain the structure shown in FIG. 5 with the cavity 116.

Other options are the provision of a PID (photo-imageable dielectric), no-flow and wet/dry etching (when a feature is desired in a cavity).

Thereafter, as shown in FIG. 6, the process control component 110 may be accommodated in the cavity 116 and may be connected with the stack 102, for instance by soldering using solder structures 150. The processing components 108 may be surface-mounted on the stack 102 and may be connected therewith also by soldering using solder structures 150.

In order to obtain the electronic device 130 shown in FIG. 7, the component carrier 100 obtained according to FIG. 6 may be connected with an upper main surface of the mounting base 114, for instance, a printed circuit board. However, before this assembly, the upper main surface of the PCB type mounting base 114 may be provided with a heat removal structure 112 as illustrated in FIG. 2. Upon assembling the component carrier 100 according to FIG. 6 with the mounting base 114 with the preformed heat removal structure 112 on top thereof, a proper thermal connection between the process control component 110 and the mounting base 114 may be obtained. This may be further promoted by a thermally conductive thermal interface material 120 in between.

In the embodiment of FIG. 7, further electronic components 163 are embedded in the mounting base 114. Additionally or alternatively, the further electronic components 163 may also be surface mounted on the mounting base 114. The further electronic components 163 are electrically coupled with the components 108, 110 mounted at the stack 102 for signal communication. The process control component 110 may be configured for also controlling processes executed by the further electronic components 163 of the mounting base 114 on which the component carrier 100 is mounted.

Figure 8:
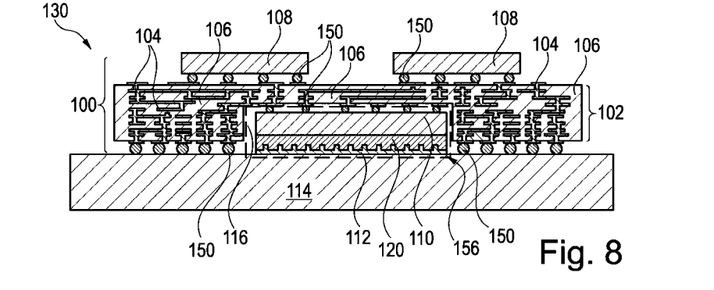
FIG. 8 illustrates a cross-sectional view of a component carrier-based electronic device according to another exemplary embodiment of the invention.

FIG. 8 illustrates a cross-sectional view of an electronic device 130 with a component carrier 100 according to another exemplary embodiment of the invention.

The electronic device 130 shown in FIG. 8 differs from the electronic device shown in FIG. 3 in that, according to FIG. 8, the process control component 110 is mounted in a cavity 116 in a bottom portion of the stack 102 rather than being fully embedded therein. FIG. 8 shows a section 156 which will be described in further detail referring to FIG. 9 to FIG. 11.

Figure 9:
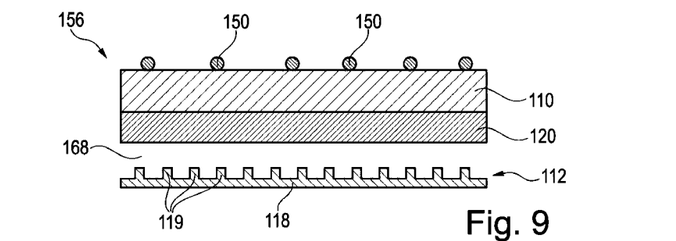
FIG. 9, FIG. 10 and FIG. 11 illustrate cross-sectional views of a section of the electronic device according to FIG. 8 showing heat transfer processes.
Figure 10:
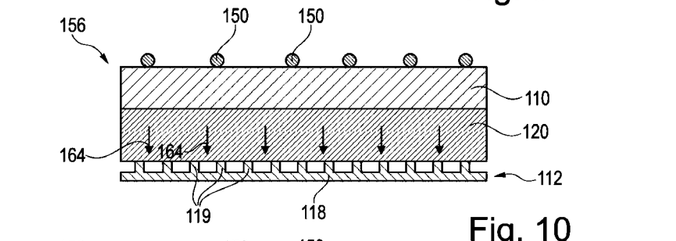
Figure 11:
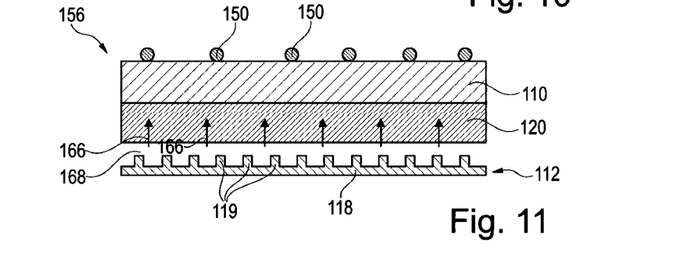

FIG. 9 to FIG. 11 illustrate cross-sectional views of section 156 of the electronic device 130 of FIG. 8 showing heat transfer processes. Referring to section 156 and FIG. 8 to FIG. 11, the electronic device 130 comprises thermal interface material 120 which is arranged between the heat removal structure 112 and the process control component 110, for instance attached to the process control component 110. The thermal interface material 120 is configured for expanding when heated to thereby trigger a thermal coupling between the heat removal structure 112 and a surface of said process control component 110 (see arrows 164 in FIG. 10). Apart from this, the thermal interface material 120 is configured for shrinking again at lower temperatures to a smaller size in which the heat removal structure 112 is no longer thermally coupled with the surface of said process control component 110 (see arrows 166 in FIG. 11) by the thermal interface material 120. The heat removal structure 112 in collaboration with the thermal interface material 120 may thus ensure a dynamic heat spreading with the thermal interface material 120 expanding when heated.

Again, referring to FIG. 9, a scenario is shown which illustrates a state before connecting the heat removal structure 112 with the process control component 110 via the thermal interface material 120. A lower main surface of the process control component 110 is provided with the thermally conductive paste constituting thermal interface material 120. An upper main surface of the process control component 110 is provided with solder structures 150, for instance solder bumps or copper posts with solder cap. In view of gap 168, the process control component 110 is not thermally coupled with the heat removal structure 112.

As shown in FIG. 10, the heat removal structure 112 (which may be formed on an upper main surface of a mounting base 114) may be connected with the process control component 110 by heating until the thermally conductive paste or TIM (thermal interface material) contacts the heat removal structure 112 due to thermal expansion.

As shown in FIG. 11, subsequent cooling will trigger thermal contraction of the thermal interface material 120 to thereby thermally decouple process control component 110 with respect to heat removal structure 112. In view of re-established gap 168, the process control component 110 is no more thermally coupled with the heat removal structure 112.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

The invention claimed is:
1. An electronic device, comprising:
a stack comprising at least one electrically conductive layer structure and/or at least one electrically insulating layer structure;
a plurality of processing components on and/or in the stack;

a process control component coupled with at least part of the processing components through at least one electrical connection through the stack for transmitting signals and configured for controlling processes executed by the processing components and/or by the process control component; and a heat removal structure on or above which at least one of the process control component and the processing components is arranged for removing heat away from the stack;

wherein the at least one electrical connection is arranged between one main surface of the process control component and at least one main surface of the coupled part of processing components;

wherein the heat removal structure is arranged at another main surface of the process control component opposite to the one main surface of the process control component or at at least one other main surface of the coupled part of processing components opposite to the at least one main surface of the coupled part of processing components.

2. The electronic device according to claim 1, wherein at least the stack, the processing components and the process control component form part of a component carrier.

3. The electronic device according to claim 1, configured as a component carrier.

4. The electronic device according to claim 1, further comprising at least one of the following features:
wherein the at least one electrically conductive layer structure comprises at least one of the group consisting of copper, aluminum, nickel, silver, gold, palladium, and tungsten;
wherein the at least one electrically insulating layer structure comprises at least one of the group consisting of reinforced or non-reinforced resin, epoxy resin or bismaleimide-triazine resin, FR-4, FR-5, cyanate ester, polyphenylene derivate, glass, prepreg material, polyimide, polyamide, liquid crystal polymer, epoxy-based build-up film, polytetrafluoroethylene, a ceramic, and a metal oxide;
wherein the component carrier is shaped as a plate;
wherein the component carrier is configured as one of the group consisting of a printed circuit board, a substrate, and an interposer;
wherein the component carrier is configured as a laminate-type component carrier.

5. The electronic device according to claim 1, wherein the process control component is configured for controlling communication between the processing components.

6. The electronic device according to claim 1, further comprising one of the following features:
the heat removal structure is assigned to the process control component, whereas no heat removal structure is assigned to the processing components;
a respective heat removal structure is assigned to each of the processing components, whereas no heat removal structure is assigned to the process control component;
a respective heat removal structure is assigned to each of the processing components and to the process control component.

7. The electronic device according to claim 1, further comprising at least one of the following features:
wherein the process control component and the processing components are arranged at respective different vertical levels;
wherein at least one of the process control component and the processing components is embedded in an interior of the stack or is arranged in a cavity formed in the stack, wherein in particular the heat removal structure is arranged at an exposed surface of the at least one of the process control component and/or the processing components arranged in the cavity;
wherein at least one of the process control component and the processing components is surface-mounted on the stack, wherein in particular no heat removal structure is arranged at the at least one of the process control component and the processing components being surface-mounted;
wherein the heat removal structure is configured for removing heat towards a mounting surface of the stack and into a mounting base,
wherein the stack is mounted at the mounting surface on the mounting base;
wherein the heat removal structure is configured for heat spreading;
wherein the heat removal structure is thermally decoupled from the at least one other of the process control component and the processing components being not mounted on or above the heat removal structure.

8. The electronic device according to claim 1, wherein the heat removal structure comprises a thermally conductive sheet.

9. The electronic device according to claim 8, further comprising one of the following features:
wherein the heat removal structure comprises an array of thermally conductive protrusions extending vertically from the thermally conductive sheet;
wherein the heat removal structure has a flat surface.

10. The electronic device according to claim 8, further comprising:
a thermally conductive thermal interface material on the thermally conductive sheet, and at least partially covering the array of protrusions.

11. The electronic device according to claim 1, further comprising at least one of the following features:
wherein the heat removal structure has at least the same lateral extension as the at least one of the process control component and the processing components being mounted on or above the heat removal structure;
multiple heat removal structures, wherein a respective one of the process control component and the processing components is mounted on or above an assigned one of the heat removal structures;
wherein a lateral extension of the process control component is larger than a lateral extension of each of the processing components;
wherein the at least one electrically conductive layer structure is configured so that electric signal paths within the stack between the process control component and the processing components are substantially vertical.

12. The electronic device according to claim 1, further comprising:
a mounting base on which the stack with the process control component and the processing components is mounted.

13. The electronic device according to claim 12, further comprising at least one of the following features:
wherein the heat removal structure is arranged at an interface between the mounting base and the stack with the process control component and the processing components;

wherein the heat removal structure is fixed on the mounting base and is attached to, or is to be attached to, one of the process control component and the processing components at a bottom of the stack;

wherein a thermal interface material, arranged between the heat removal structure and said at least one of the process control component and the processing components, is configured to expand when heated to thereby trigger a thermal coupling between the heat removal structure and a surface of said at least one of the process control component and the processing components, and being configured to shrink at lower temperatures to a smaller size in which the heat removal structure is not thermally coupled with the surface of said at least one of the process control component and the processing components by the thermal interface material;

wherein the process control component is configured for controlling processes executed by the mounting base.

14. A method of manufacturing an electronic device the method comprising:

mounting a plurality of processing components on and/or in a stack comprising at least one electrically conductive layer structure and/or at least one electrically insulating layer structure;

mounting a process control component, configured for controlling processes executed by at least one of the process control component and the processing components, on and/or in the stack in such a way that the process control component is coupled through at least one electrical connection through the stack with at least part of the processing components for transmitting signals; and arranging at least one of the process control component and the processing components on or above a heat removal structure for removing heat out of the stack,_;

wherein the at least one electrical connection is arranged between one main surface of the process control component and at least one main surface of the coupled part of processing components;

wherein the heat removal structure is arranged at another main surface of the process control component opposite to the one main surface of the process control component or at at least one other main surface of the coupled part of processing components opposite to the at least one main surface of the coupled part of processing components.

15. The method according to claim 14, wherein the method comprises:

forming the heat removal structure on a mounting surface of a mounting base; and thereafter mounting the stack with the process control component and the processing components on the mounting base to thereby thermally couple the heat removal structure with said at least one of the process control component and the processing components.

* * * * *